(12) United States Patent
Kawamura et al.

(10) Patent No.: US 7,799,156 B2
(45) Date of Patent: Sep. 21, 2010

(54) METHOD FOR MANUFACTURING CERAMIC SUBSTRATE AND CERAMIC SUBSTRATE

(75) Inventors: Akiyoshi Kawamura, Nagaokakyo (JP); Takako Sato, Moriyama (JP); Osamu Chikagawa, Yasu (JP); Takaki Murata, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/547,621

(22) Filed: Aug. 26, 2009

(65) Prior Publication Data

US 2009/0305865 A1 Dec. 10, 2009

Related U.S. Application Data

(63) Continuation of application No. PCT/JP2009/053159, filed on Feb. 23, 2009.

(30) Foreign Application Priority Data

Mar. 3, 2008 (JP) ............................. 2008-052383
Mar. 14, 2008 (JP) ............................. 2008-065347

(51) Int. Cl.
*B29C 65/00* (2006.01)
*C03B 29/00* (2006.01)
(52) U.S. Cl. .................................. 156/73.6; 156/89.11
(58) Field of Classification Search ........................ None
See application file for complete search history.

(56) References Cited

U.S. PATENT DOCUMENTS

| 5,798,469 A | * | 8/1998 | Nufer ........................... 75/246 |
| 5,855,711 A | | 1/1999 | Araki et al. |
| 6,058,945 A | * | 5/2000 | Fujiyama et al. ............. 134/1.3 |
| 2006/0234021 A1 | * | 10/2006 | Tanei et al. .................. 428/210 |

FOREIGN PATENT DOCUMENTS

| JP | 4-111769 A | 4/1992 |
| JP | 9-266363 A | 10/1997 |

(Continued)

OTHER PUBLICATIONS

Official Communication issued in International Patent Application No. PCT/JP2009/053159, mailed on Mar. 24, 2009.

(Continued)

*Primary Examiner*—Mark A Osele
*Assistant Examiner*—Nickolas Harm
(74) *Attorney, Agent, or Firm*—Keating & Bennett, LLP

(57) ABSTRACT

When a ceramic substrate is manufactured through a constraint firing step that uses a constraining layer, the constraining layer is removed without causing significant damage to a sintered base layer or an electrode formed on the surface of the sintered base layer, and the electrode can be reliably exposed. A green stacked body having a base layer and a constraining layer disposed so as to be in contact with at least one principal surface of the base layer is formed. A fired stacked body having a sintered base layer and a green constraining layer is then obtained by firing the green stacked body to sinter the base layer. Subsequently, the constraining layer is removed from the sintered base layer by vibrating media that are disposed so as to be in contact with the constraining layer.

12 Claims, 6 Drawing Sheets

FOREIGN PATENT DOCUMENTS

| | | |
|---|---|---|
| JP | 10-138116 A | 5/1998 |
| JP | 2000-315667 A | 11/2000 |
| JP | 2002-198646 A | 7/2002 |
| JP | 2004-165295 A | 6/2004 |
| JP | 2006-303437 A | 11/2006 |

OTHER PUBLICATIONS

Kawamura et al. "Method for Smoothing Electrode, Method for Manufacturing Ceramic Substrate, and Ceramic Substrate"; U.S. Appl. No. 12/547,616, filed Aug. 26, 2009.

* cited by examiner

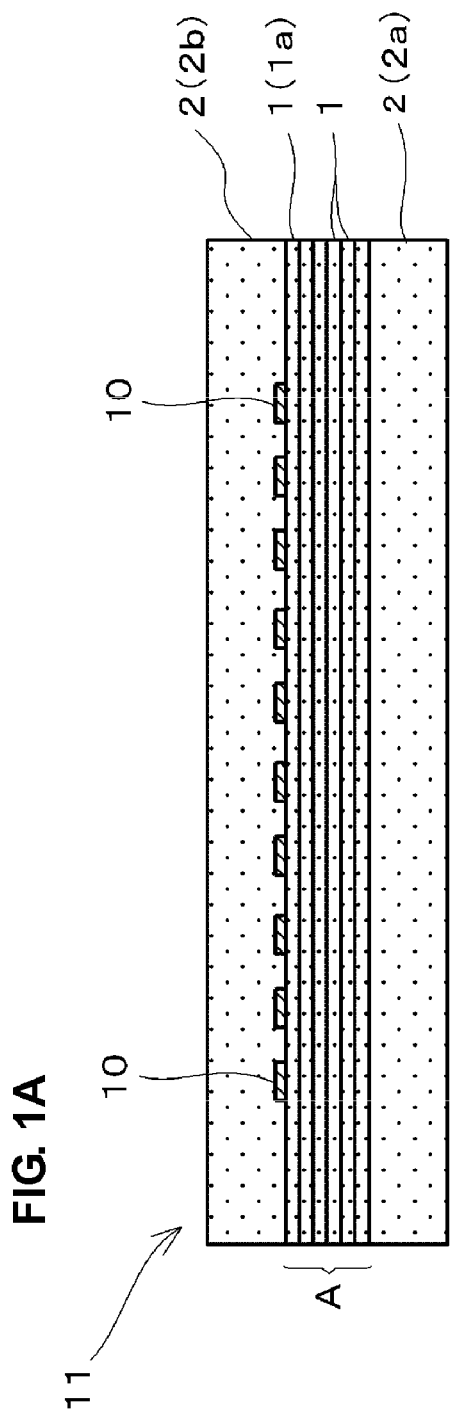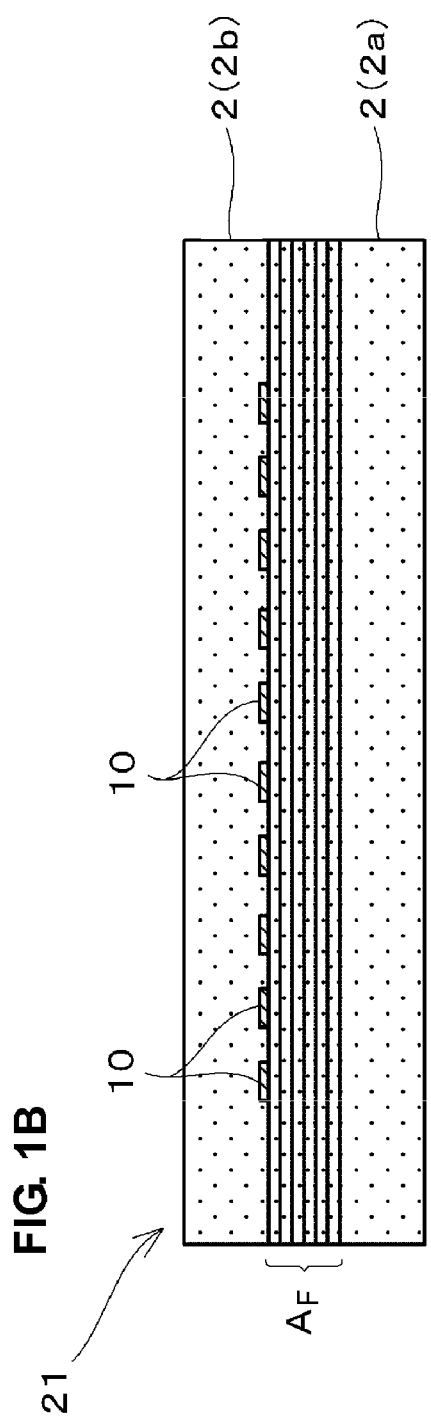

METHOD FOR MANUFACTURING CERAMIC SUBSTRATE AND CERAMIC SUBSTRATE

BACKGROUND OF THE INVENTION

1. Field of the Invention

The present invention relates to a method for manufacturing a ceramic substrate and a ceramic substrate. In particular, the present invention relates to a method for manufacturing a ceramic substrate through a constraint firing step in which a constraining layer is disposed on a base layer that is to be a ceramic substrate after firing and firing is conducted while the shrinkage of the base layer in a planar direction is suppressed, and a ceramic substrate manufactured by the method.

2. Description of the Related Art

In a ceramic substrate that must have high planar dimensional accuracy among ceramic electronic components, firing shrinkage in a planar direction in a firing step or a variation of the shrinkage significantly affects product quality.

To fire a green base layer (ceramic stacked body) that is used to define a ceramic substrate (multilayer wiring substrate) after firing while suppressing the shrinkage in a firing step, a method for performing firing so as not to cause firing shrinkage in a planar direction has been proposed. This is achieved by performing firing (hereinafter referred to as "constraint firing") while constraining layers 52a and 52b primarily composed of a sintering resistant material, such as alumina, that is not substantially sintered at a firing temperature of a base layer 51 are disposed so as to be in contact with both principal surfaces of the base layer 51 as schematically shown in FIG. 9 (see, for example, Japanese Unexamined Patent Application Publication No. 2002-198646).

In the method of Japanese Unexamined Patent Application Publication No. 2002-198646, the constraining layers that remain that are not sintered after the firing step are physically and mechanically removed by a known method such as wet blasting, sandblasting, or ultrasonic cleaning.

However, where the constraining layers are removed from a sintered base layer by wet blasting or sandblasting after the firing step as described in Japanese Unexamined Patent Application Publication No. 2002-198646, the sintered base layer is damaged and the strength of the sintered base layer is decreased, which may cause cracks. Furthermore, an electrode disposed on a surface of the sintered base layer may be damaged. This reduces the strength of the electrode due to a decrease in the thickness of the electrode that is rubbed off or reduces the connectivity between the electrode and another component due to a decrease in the smoothness of an electrode surface. Consequently, the reliability of the ceramic substrate produced by the method is reduced.

SUMMARY OF THE INVENTION

To overcome the problems described above, preferred embodiments of the present invention provide a method for efficiently manufacturing a ceramic substrate with high reliability and a ceramic substrate with high reliability manufactured by the method. According to the method, when a ceramic substrate is manufactured through a constraint firing step, a constraining layer is removed from a sintered base layer without causing significant damage to, for example, the sintered base layer and an electrode provided on the surface of the sintered base layer, and the sintered base layer and the electrode can be effectively and reliably exposed.

A method for manufacturing a ceramic substrate according to a preferred embodiment of the present invention includes a first step of forming a green stacked body including a base layer that defines a ceramic substrate after firing, the base layer including ceramic powder and glass material, and a constraining layer arranged so as to be in contact with at least one principal surface of the base layer, the constraining layer being primarily composed of ceramic powder that is not substantially sintered at a sintering temperature of the base layer, a second step of obtaining a fired stacked body having a sintered base layer and a green constraining layer by firing the green stacked body to sinter the base layer, and a third step of removing the constraining layer from the sintered base layer by vibrating media that are arranged so as to be in contact with the constraining layer.

In the third step, an ultrasonic wave is preferably applied to vibrate the media while the fired stacked body and the media are immersed in a processing solution.

In the third step, the ultrasonic wave is preferably applied while the fired stacked body is disposed in a tray, with the media being spread over the tray, such that the constraining layer is in contact with the media.

In the third step, the fired stacked body is preferably disposed in a tray such that the constraining layer faces upward, the media are spread over the fired stacked body, and the ultrasonic wave is applied while the constraining layer is in contact with the media.

When a constraining layer of the fired stacked body is disposed on both of one principal surface side and another principal surface side of the sintered base layer, in the third step, the fired stacked body is preferably disposed in a tray, with the media being spread over the tray, the media are further spread over the fired stacked body, and the ultrasonic wave is applied while the constraining layer disposed on both of the one principal surface side and the other principal surface side of the fired stacked body is in contact with the media.

Deaerated water is preferably used as the processing solution, for example.

The specific gravity of the media is preferably greater than that of the processing solution.

The hardness of the media is preferably greater than that of the constraining layer.

The media preferably have a substantially spherical shape, for example.

The media are preferably made of zirconia, for example.

A method for manufacturing a ceramic substrate according to a preferred embodiment of the present invention includes a first step of forming a green stacked body including a base layer that defines a ceramic substrate after firing, the base layer including ceramic powder and glass material, an electrode being formed on a surface of the base layer, and a constraining layer disposed so as to be in contact with at least one principal surface of the base layer, the constraining layer being primarily composed of ceramic powder that is not sintered at a sintering temperature of the base layer, a second step of obtaining a fired stacked body having a reaction layer formed between a sintered base layer and the constraining layer by a reaction therebetween by firing the green stacked body to sinter the base layer, and a third step of removing the constraining layer from the sintered base layer by vibrating media that are disposed so as to be in contact with the constraining layer, wherein, in the third step, at least a portion of the electrode is exposed while the reaction layer is remains at a boundary between a periphery of the electrode and the sintered base layer around the electrode.

The reaction layer is preferably a layer including a ceramic component included in the constraining layer and a glass component included in the base layer. Specifically, the reaction layer is preferably formed with the following mechanism. The glass component included in the base layer diffuses into the constraining layer and the ceramic component included in the constraining layer is then fixed with the glass component. Alternatively, the ceramic component included in the constraining layer and the glass component that has diffused into the constraining layer from the base layer are mixed together at the atomic level.

The reaction layer preferably remains not only at the boundary between the periphery of the electrode and the sintered base layer around the electrode but also in a different region of a surface of the sintered base layer.

A ceramic substrate according to a preferred embodiment of the present invention is manufactured by the method for manufacturing a ceramic substrate according to a preferred embodiment of the present invention described above.

In the method for manufacturing a ceramic substrate according to a preferred embodiment of the present invention, after a fired stacked body having a sintered base layer and a green constraining layer is made by firing a green stacked body to sinter a base layer, the constraining layer is removed from the sintered base layer by vibrating media that are disposed so as to be in contact with the constraining layer. Thus, the constraining layer is removed without causing damage to, for example, the sintered base layer and an electrode disposed on the surface of the sintered base layer, and the sintered base layer and the electrode can be effectively and reliably exposed. Consequently, a ceramic substrate with high reliability can be efficiently manufactured.

In various preferred embodiments of the present invention, the constraining layer is removed at a portion at which media vibrates, and, for example, the constraining layer and a reaction layer formed by a reaction between the constraining layer and the glass component included in the base layer can be efficiently removed without causing damage to the sintered base layer by suitably choosing the magnitude of the vibration or the shape and size of the media. Where an electrode is disposed on a surface of the sintered base layer, a ceramic substrate having excellent smoothness can be efficiently manufactured by selectively breaking a protruding reaction layer that is easily formed at the periphery of the electrode.

In various preferred embodiments of the present invention, a step of preliminarily removing an easily removable portion of the green constraining layer from the sintered base layer using a hand or a simple jig, such as a brush, that is, a constraining-layer preliminary removal step can preferably be performed between the second step of firing the green stacked body and the third step of removing the constraining layer from the sintered base layer.

The phrase "media that are disposed so as to be in contact with the constraining layer" includes the following concepts. For example, when the media are disposed on the constraining layer, the media momentarily rise from the constraining layer due to the vibration, but fall down at the next moment and thus the media become disposed on the constraining layer again. Alternatively, when the fired stacked body is disposed on the media such that the surface of the fired stacked body on which the constraining layer is disposed faces downward, even if the constraining layer is momentarily not in contact with the media due to the vibration of the media, at the next moment the constraining layer is in contact with the media again.

When, in the third step, an ultrasonic wave is applied to vibrate the media while the fired stacked body and the media are immersed in a processing solution, the media are efficiently vibrated and the vibrational state of the media can be precisely controlled by using the ultrasonic wave. Furthermore, by shifting the removed constraining layer to the processing solution, the reattachment of the constraining layer to the sintered base layer can be prevented.

When, in the third step, the ultrasonic wave is applied while the fired stacked body is disposed in a tray, with the media being spread over the tray, such that the constraining layer is in contact with the media, the constraining layer can be extremely efficiently removed from the base layer by vibrating the media while the constraining layer is closely in contact with the media.

In other words, since the media vibrate, the constraining layer is sometimes not in contact with the media from a microscopic viewpoint, but the state in which the constraining layer is almost continuously in contact with the media can be maintained. Thus, the constraining layer can be efficiently removed.

When the constraining layer is disposed on both of one principal surface side and another principal surface side of the sintered base layer, in the third step, the fired stacked body is disposed in a tray, with the media being spread over the tray, the media are further spread over the fired stacked body, and the ultrasonic wave is applied while the constraining layer disposed on both of the one principal surface side and the other principal surface side of the fired stacked body are in contact with the media, whereby the state in which the constraining layer is almost continuously in contact with the media can be maintained. By vibrating the media in this state, the constraining layer can be quickly removed from both surfaces of the sintered base layer.

By using deaerated water as the processing solution, the sound pressure of the ultrasonic wave is increased, and thus, the vibration of the media is increased. Therefore, the removal efficiency of the constraining layer can be further improved.

When the specific gravity of the media is greater than that of the processing solution, the media do not float in the processing solution and the media can be reliably located on the constraining layer. Thus, the constraining layer can be efficiently removed.

When the hardness of the media is greater than that of the constraining layer, the constraining layer can be efficiently removed while the brittle constraining layer are broken (ground).

When the media have a substantially spherical shape, the constraining layer can be efficiently removed because the media easily rotate and move on the constraining layer. Moreover, a ceramic substrate having good surface condition can be efficiently manufactured because such media do not easily cause damage to the sintered base layer.

When the media are made of zirconia, for example, the constraining layer can be efficiently removed because zirconia has a specific gravity of about 5.8, which is greater than that of a solution normally used for the processing solution, and zirconia also has a high Mohs hardness of about 8.5.

A reaction layer formed by a reaction between a glass component included in the base layer and a material of the constraining layer is easily formed at a portion of the constraining layer after firing that is close to the boundary between the base layer and the constraining layer. Since the reaction layer has high adhesion with the base layer and is not easily removed, the removal of the reaction layer is often problematic when the constraining layer is removed. However, the hardness of the reaction layer formed by a reaction with a glass component normally tends to be less than that of the material itself of the constraining layer (e.g., alumina). Therefore, when the media are made of zirconia, the hardness of the media is often greater than that of the reaction layer. Thus, the reaction layer can be efficiently removed.

Where, after a fired stacked body having a reaction layer formed between a sintered base layer and a constraining layer with a reaction therebetween is made by firing a green stacked body, at least a portion of the electrode is exposed by vibrating media that are disposed so as to be in contact with the constraining layer while the reaction layer is left at the boundary between the periphery of the electrode and the sintered base layer around the electrode as in another method for manufacturing a ceramic substrate according to a preferred embodiment of the present invention, the reaction layer can preferably be used to reduce the difference in elevation between the surfaces of the electrode and the sintered base layer. Thus, a ceramic substrate having excellent coplanarity due to a small difference in elevation between the surfaces of the electrode and the sintered base layer can preferably be manufactured. Furthermore, the reaction layer preferably remains so as to cover the boundary between the periphery of the electrode and the sintered base layer around the electrode, whereby the reaction layer functions as a protective layer that prevents and minimizes the migration of electrode material.

In other words, sandblasting and wet blasting are methods for grinding the layer or material to be removed or the reaction layer using an abrasive grain whereas the method of preferred embodiments of the present invention is a method for rubbing off constraining layer grains using the media. Since the vibrational energy of the media is not overly large, the constraining layers are removed, but the close-grained reaction layer is not rubbed off and most of the reaction layer can remain by adjusting, for example, the magnitude of the vibration of the media. Consequently, the reaction layer that normally remains on the surface of the sintered base layer (ceramic substrate) with a thickness of several micrometers to several tens of micrometers decreases the difference in elevation between the surfaces of the electrode and the sintered base layer. This can significantly improve coplanarity.

The reaction layer formed at the boundary between the constraining layer and the base layer by a reaction between a glass component included in the base layer and a material of the constraining layer may protrude, for example, by about several micrometers on the electrode. By adjusting the magnitude of the vibration of the media in accordance with the protruding reaction layer, the protruding portion is selectively removed such that the reaction layer has a gentle slope.

In preferred embodiments of the present invention, a step of preliminarily removing an easily removable portion of the green constraining layer from the sintered base layer using a hand or a simple jig such as a brush, that is, a constraining-layer preliminary removal step can preferably be included between the second step of firing the green stacked body and the third step of removing the constraining layer from the sintered base layer.

By leaving the reaction layer not only at the boundary between the periphery of the electrode and the sintered base layer around the electrode but also in a different region of a surface of the sintered base layer, the difference in elevation between the surfaces of the entire sintered base layer and the electrode is decreased and the coplanarity can be further improved.

A ceramic substrate according to a preferred embodiment of the present invention is manufactured by the method for manufacturing a ceramic substrate according to a preferred embodiment of the present invention described above. The constraining layer is removed while the damage to, for example, the sintered base layer (ceramic substrate) and an electrode provided on a surface of the sintered base layer are prevented, and the sintered base layer and the electrode can be reliably exposed. Thus, a ceramic substrate having excellent characteristics can preferably be provided.

Where an electrode is disposed on a surface of the sintered base layer and a reaction layer formed by a reaction between the constraining layer and the base layer in the firing step remains at the boundary between the periphery of the electrode and the sintered base layer around the electrode, a ceramic substrate having excellent characteristics and coplanarity due to a small difference in elevation between the surfaces of the electrode and the base layer can be provided.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1A shows a green stacked body that includes constraining layers disposed on upper and lower surface sides of a base layer and that is manufactured in Example 1 of a preferred embodiment of the present invention, and FIG. 1B shows a fired stacked body obtained by firing the green stacked body of FIG. 1A.

DETAILED DESCRIPTION OF PREFERRED EMBODIMENTS

Figure 2:
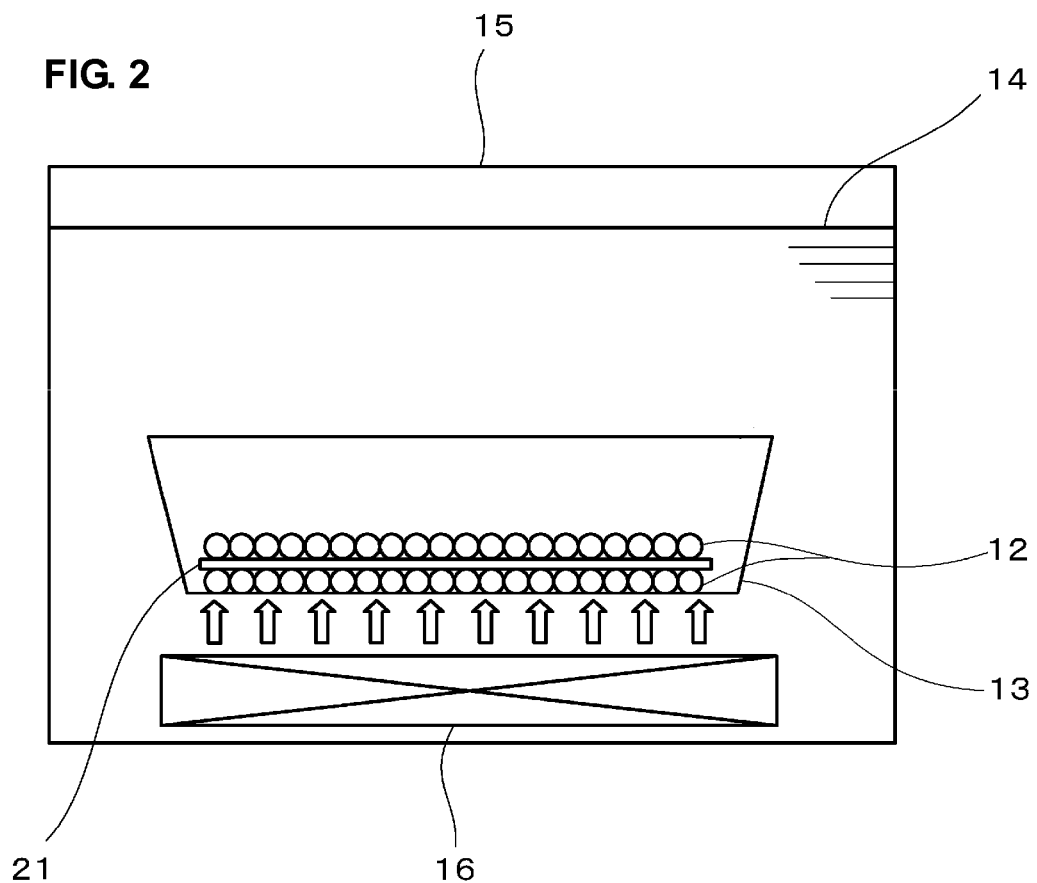
FIG. 2 shows a method for removing the constraining layers from the fired stacked body obtained by firing the green stacked body of FIG. 1A.

Examples of preferred embodiments of the present invention will be described with reference to the drawings.

Example 1

First, a base layer defining a principal portion of a ceramic substrate after firing was made by the following method.

Alumina powder was prepared as ceramic powder, and borosilicate glass powder including about 59% by weight of $SiO_2$, about 10% by weight of $B_2O_3$, about 25% by weight of CaO, and about 6% by weight of $Al_2O_3$, for example, was prepared as glass powder.

The alumina powder and the glass powder were preferably mixed, for example, in a ratio of about 40:60 by weight. Proper amounts of a binder, a dispersant, a plasticizer, an organic solvent, and other components were added to the resultant mixed powder and they were mixed to make ceramic slurry.

The ceramic slurry was then formed into a sheet by a method such as a doctor blade method, for example, to make a base-layer green sheet.

A base layer A was formed by stacking a plurality of base-layer green sheets. To evaluate characteristics, a base-layer ceramic green sheet on which an interdigital electrode (for evaluating reliability) 10 with a line width of about 0.1 mm and a gap of about 0.1 mm, for example was formed was prepared as a base-layer green sheet that defines the upper surface of the base layer A. The interdigital electrode 10 was preferably formed by screen printing Ag electrode paste, for example.

A ceramic green sheet to define a constraining layer was made as follows.

A ceramic powder that is not substantially sintered at the firing temperature of the base-layer ceramic green sheet, that is, preferably $Al_2O_3$ powder having an average particle size of about 1.0 µm, for example, in Example 1 was dispersed into an organic vehicle composed of an organic binder, an organic solvent, a plasticizer, and other components to prepare a slurry.

The obtained slurry was formed into a sheet to make a constraining-layer ceramic green sheet preferably having a thickness of about 300 µm, for example.

This constraining-layer ceramic green sheet preferably has a sintering temperature of about 1400° C. to about 1600° C., for example, and is thus not substantially sintered at the sintering temperature of the base-layer ceramic green sheet.

As shown in FIG. 1A, a constraining-layer ceramic green sheet 2 (2a), a plurality of base-layer ceramic green sheets 1, and a constraining-layer ceramic green sheet 2 (2b) were then stacked in that sequence. Subsequently, a green stacked body 11 having a structure in which constraining layers 2 (2a and 2b) were disposed on both upper and lower surface sides of the base layer (green ceramic substrate) A was made by pressure bonding at a pressure of, for example, about 5 MPa to about 200 MPa using isostatic pressing or other suitable method (refer to FIG. 1A).

In Example 1, the plurality of base-layer ceramic green sheets 1 were stacked such that the thickness of the base layer (green ceramic substrate) A is preferably about 300 µm, for example. As described above, the base-layer ceramic green sheet 1 (1a) on which the interdigital electrode (Ag electrode) 10 for evaluating reliability was formed was used as a base-layer ceramic green sheet 1 that defines the upper surface of the base layer A.

A single constraining-layer ceramic green sheet preferably having a thickness of about 300 µm, for example, was stacked on each of the upper and lower surface sides of the base layer (green ceramic substrate) A to form the constraining layers 2 (2a and 2b) having a thickness of about 300 µm.

Although the base layer A having a multilayer structure was made by stacking the plurality of base-layer ceramic green sheets 1 in Example 1, a base layer having a single layer structure may be made using a single base-layer ceramic green sheet 1 to manufacture a single-plate ceramic substrate.

Although the constraining layers 2 were disposed on both of the upper and lower surface sides of the base layer A in Example 1, the constraining layer 2 may be disposed on only one principal surface of the base layer A.

In Example 1, each of the constraining layers 2 was defined by a single constraining-layer ceramic green sheet. However, each constraining layer 2 may be formed by stacking a plurality of constraining-layer ceramic green sheets.

The green stacked body 11 was then heat-treated at a low debinding temperature (e.g., about 400° C.) in the atmosphere to remove an organic substance such as a binder.

After that, the temperature was increased to about 900° C., for example, such that the base layer is sintered but the ceramic powder defining the constraining layers is not sintered, to fire the green stacked body 11. Thus, as shown in FIG. 1B, a fired stacked body 21 with green constraining layers 2 (2a and 2b) disposed on both principal surfaces of a sintered base layer $A_F$ was obtained.

The constraining layers 2 (2a and 2b) were removed from the fired stacked body 21 obtained as described above by the following method.

As shown in FIG. 2, spherical media (hereinafter also referred to as zirconia balls) 12 preferably having a diameter of about 2 mm and made of zirconia ($ZrO_2$), for example, were spread over a stainless steel tray 13, and the fired stacked body 21 with green constraining layers 2 (FIG. 1B) disposed on both principal surfaces of the sintered base layer $A_F$ (FIG. 1B) was disposed thereon. Furthermore, for example, at least a single layer of zirconia balls 12 were disposed on the fired stacked body 21 (a single layer of zirconia balls 12 is provided in FIG. 2).

All of the zirconia balls 12, the tray 13, and the fired stacked body 21 were inserted into an ultrasonic cleaning tank (output about 600 W, frequency about 40 KHz) 15 filled with a processing solution 14. A constraining-layer removal process was performed for about 30 minutes by applying an ultrasonic wave using an ultrasonic oscillator 16 to vibrate the zirconia balls 12.

To increase sound pressure when the ultrasonic wave is applied, deaerated water was preferably used as the processing solution 14.

For comparison, the constraining layers were removed from a fired stacked body with green constraining layers disposed on both principal surfaces of the sintered base layer that was made by the same method as that of Example 1, by spraying slurry including about 15% of a about #500 alumina abrasive grain at about 0.15 MPa through wet blasting.

After the sintered base layers from which the constraining layers were removed by the methods of Example 1 and the Comparative Example were cleaned, a Ni plating film having a thickness of about 5 µm, for example, was formed on the interdigital electrode (Ag electrode) that is disposed on the surface of each of the sintered base layers.

Subsequently, a Pd plating film having a thickness of about 0.2 µm, for example, was formed on the Ni plating film, and an Au plating film having a thickness of about 0.1 µm, for example, was formed on the Pd plating film. As a result, an electrode with a plating film having a three-layer structure was formed on the Ag electrode.

For the sample obtained by removing the constraining layers using the method of Example 1 and the sample obtained by removing the constraining layers using the method of Comparative Example, the surface roughness Ra of the electrodes (interdigital electrodes), the wire-pull strength (W/B pull strength) of the electrodes, and the flexural strength were measured while a reliability test was conducted to evaluate reliability. The results are shown in Table 1.

TABLE 1

|  | Example (N = 10) | Comparative Example (N = 10) |
| --- | --- | --- |
| Surface roughness Ra (μm) | 0.15 | 0.60 |
| Wire-pull strength (average) (gf) | 8.05 | 6.45 |
| Flexural strength (average) (MPa) | 325 | 295 |
| Reliability test | Good | Poor |

The surface roughness Ra of the electrodes, the wire-pull strength, and the flexural strength were measured by the methods described below, and the reliability test was conducted by the method described below.

(1) Surface Roughness Ra

The surface roughness Ra was obtained by measuring the line roughness of the interdigital electrode using a laser microscope.

(2) Wire-Pull Strength

An Au wire with a diameter of about 20 μm and a length of about 800 μm was connected to the interdigital electrode, and the wire was pulled using a wire-pull tester. The tensile force when the wire was cut or when the connecting portion and its vicinity were broken or peeled off was defined as the wire-pull strength.

(3) Flexural Strength

A test piece having a size of L (length)×W (width)×T (thickness)=about 30 mm×about 4 mm×about 0.3 mm was processed with a three-point bending tester. The load when the test piece was broken was defined as the flexural strength.

(4) Reliability Test

A voltage of about 20 V was applied to a ceramic substrate on which an interdigital electrode with line/space=about 100 μm/about 100 μm was formed, for about 120 hours in an atmosphere of about 85° C. and about 85% RH. When insulation resistance (IR) degradation and Ag migration were not caused, the result was defined as good. When either IR degradation or Ag migration was caused, the result was defined as poor.

As shown in Table 1, the surface roughness Ra of the electrode was about 0.60 μm, which was relatively high, for the sample of the Comparative Example. In contrast, the surface roughness Ra of the electrode was about 0.15 μm, which was relatively low, for the sample of the Example. It was confirmed that the sample of the Example had significantly better smoothness than that of the Comparative Example.

It was confirmed that the wire-pull strength of about 8.05 gf of the sample of the Example was greater than the wire-pull strength of about 6.45 gf of the sample of the Comparative Example.

It was confirmed that the flexural strength of about 325 MPa of the sample of the Example was greater than the flexural strength of about 295 MPa of the sample of the Comparative Example.

It was also confirmed that the sample of the Comparative Example had poor reliability in the reliability test whereas the sample of the Example had good reliability.

It was confirmed from the results described above that, according to the method of Example 1 in which a fired stacked body having a sintered base layer and green constraining layers is made and the constraining layers are then removed from the sintered base layer by applying an ultrasonic wave to vibrate media that are disposed so as to be in contact with the constraining layers, the constraining layers can be efficiently removed and the surface smoothness of the sintered base layer can be improved without causing damage to the ceramic surface defining the sintered base layer or the electrode formed on the surface of the base layer, for example.

According to the knowledge of the inventors, in the method of the Example described above, the media momentarily rise from the constraining layers due to their vibration, but the media almost continuously remain on the constraining layers from a macroscopic viewpoint. Thus, the energy provided to the fired stacked body when the media settle can be decreased. Accordingly, damage to the ceramic surface or the electrode can be suppressed as much as possible.

In Example 1, spherical zirconia balls having a diameter of about 2 mm, for example, are preferably used as the media and the constraining layers are removed by applying an ultrasonic wave to vibrate the media. Therefore, when the constraining layers on the electrode disposed on the surface of the sintered base layer are removed, an effect in which the electrode is rolled by the media is produced after the constraining layer grains on the electrode are removed with the media, which lowers surface roughness. Such low surface roughness of the electrode improves the wire-pull strength, which is well known.

Furthermore, a grain boundary is not readily formed in an Au plating film disposed on the electrode surface due to low surface roughness, and a phenomenon in which Ni migrates to the surface through the grain boundary during heat treatment is prevented. It is believed that this also contributes to the improved wire-pull strength.

In the method of Example 1, the energy provided to the ceramic substrate from vibrating media is preferably sufficient to remove a reaction layer formed between the sintered base layer and the constraining layers, but is not sufficient to grind the sintered base layer (the substrate itself). Thus, the substrate itself is not significantly ground and the damage to the surface of the substrate can be decreased as compared to the Comparative Example. As a result, minute flaws that could cause the destruction of the substrate itself are prevented from developing, and the flexural strength can be improved as compared to the Comparative Example (refer to Table 1). In other words, high flexural strength is achieved in the method of Example 1 because minute flaws that could cause the destruction of the substrate itself do not readily develop and the minimum value of the flexural strength is increased while the variation thereof is decreased rather than the strength of the substrate itself being improved, whereby an average of flexural strength is increased.

Although not shown in Table 1, the ceramic substrate manufactured by the method of Example 1 preferably had a thickness of about 0.3 mm as designed, whereas the ceramic substrate manufactured by the method of the Comparative Example had a thickness of about 0.285 mm. In the Comparative Example, the thickness of the ceramic substrate is decreased by about mm for both principal surfaces, which may cause the decreased flexural strength.

Figure 3:
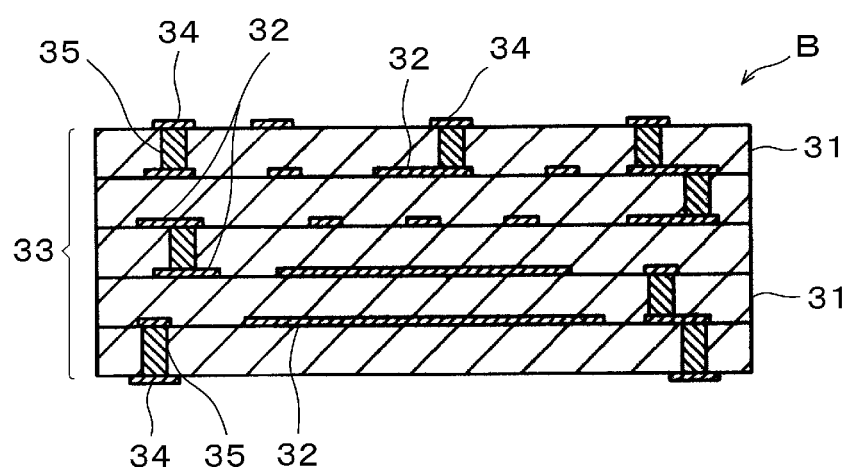
FIG. 3 shows an example of a ceramic multilayer substrate according to a preferred embodiment of the present invention that can be manufactured using a method according to a preferred embodiment of the present invention.

Even where the method of Example 1 is applied to the manufacture of a ceramic multilayer substrate having a common structure, that is, a ceramic multilayer substrate B that includes inner conductors 32 disposed between a plurality of stacked insulating ceramic layers 31 and a surface conductor 34 formed on the surface of a stacked body 33 and that has a structure in which the inner conductors 32 are connected to each other or each of the inner conductors 32 and the surface conductor 34 are connected through a via hole conductor 35 as shown in FIG. 3, the same advantages as those described with respect to in Example 1 are achieved.

Example 2

A ceramic substrate was manufactured by the step of removing the constraining layers from the sintered stacked body after firing in the same method as that of Example 1, except that spherical media (zirconia balls) having a diameter of about 1 mm and made of zirconia ($ZrO_2$) and spherical zirconia balls having a diameter of about 3 mm were used.

Consequently, it was confirmed that the removal of the constraining layers becomes more difficult when the zirconia balls having a diameter of about 1 mm were used as media.

This is because, when the zirconia balls having a diameter of about 1 mm were used, sufficient energy to break a reaction layer formed between the sintered base layer and the constraining layers was not provided due to their mass being relatively small even if the media were vibrated by applying an ultrasonic wave. When the output of the ultrasonic wave was increased to provide higher energy (that is, the sound pressure was increased), the media flew out of the tray due to their mass being too small. As a result, a desired effect was not produced.

When the zirconia balls having a diameter of about 3 mm were used as media, it was confirmed that a region in which the constraining layers were not removed partially remained and the removal of the constraining layers became insufficient.

This is because, when the zirconia balls having a diameter of about 3 mm were used, sufficient energy was provided due to their mass being relatively large, but the intervals between contact points became excessively large due to their curvature being too large, which caused uneven removal of the constraining layers. To completely remove the constraining layers by uniformly rubbing off the entire surface of the substrate with the zirconia balls having a diameter of about 3 mm, a long period of time is required to conduct the constraining-layer removal step, which decreases productivity.

Accordingly, spherical zirconia balls having a diameter in a range of about 1 mm about 3 mm, for example, are preferably used under the conditions described in Example 1.

However, since the preferable diameter range of the media is affected by the thickness of the constraining layer, the material of the constraining layer, the specific gravity of the processing solution, or other factors, the preferable diameter range of the media is not necessarily limited to the range described above.

Example 3

First, a base layer defining a principal portion of a ceramic substrate after firing was made by the following method.

Alumina powder was prepared as ceramic powder, and borosilicate glass powder including about 59% by weight of $SiO_2$, about 10% by weight of $B_2O_3$, about 25% by weight of CaO, and about 6% by weight of $Al_2O_3$, for example, was also prepared as glass powder.

The alumina powder and the glass powder were preferably mixed, for example, in a ratio of about 40:60 by weight. Proper amounts of a binder, a dispersant, a plasticizer, an organic solvent, and other components were added to the resultant mixed powder and they were mixed to make ceramic slurry.

The ceramic slurry was then formed into a sheet by a method such as a doctor blade method to make a base-layer green sheet.

Figure 4:
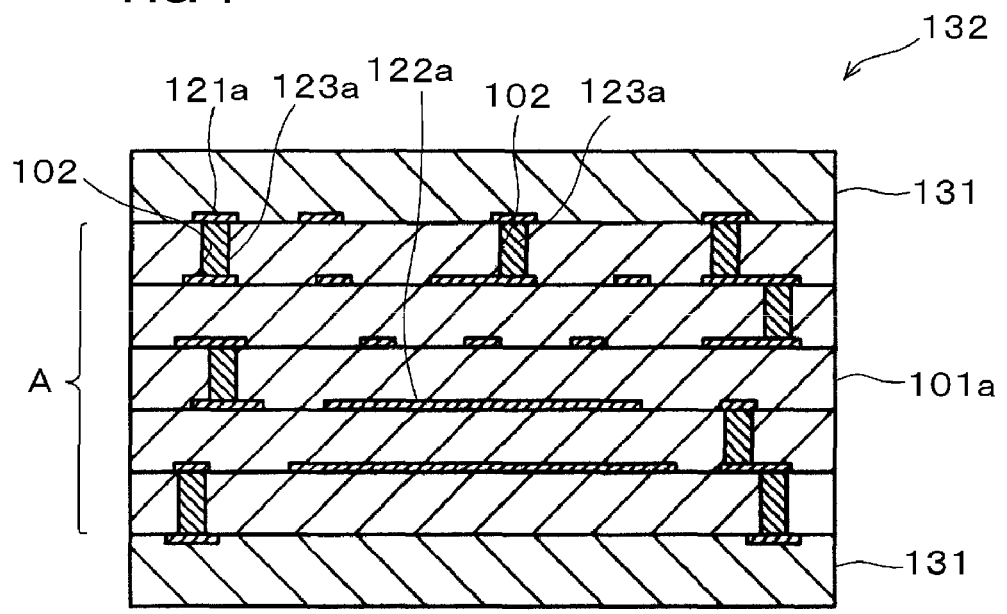
FIG. 4 shows a green stacked body that includes constraining layers disposed on both upper and lower surface sides of a base layer and that is manufactured in an Example 3 of a preferred embodiment of the present invention.

Subsequently, a through hole 102 (FIG. 4) arranged to form a via hole conductor was preferably formed in the obtained base-layer ceramic green sheet 101a. The through hole 102 was preferably filled with conductive paste or conductive powder to form a green via hole conductor 123a (FIG. 4). In Example 3, the through hole 102 was preferably filled with conductive paste composed of Ag, for example, that is a conductive component.

A green surface electrode 121a and inner conductors 122a were preferably formed on the base-layer ceramic green sheet 101a by printing, for example, Ag conductive paste (refer to FIG. 4).

A constraining-layer ceramic green sheet was made as follows. A ceramic powder (alumina powder in Example 3) that is not substantially sintered at the firing temperature of the base-layer ceramic green sheet was dispersed into an organic vehicle composed of an organic binder, an organic solvent, a plasticizer, and other components to prepare a slurry.

The obtained slurry was formed into a sheet to make a constraining-layer ceramic green sheet.

In Example 3, the thickness of the constraining-layer ceramic green sheet was preferably set to be about 300 µm, for example, to achieve sufficient constraining force.

As shown in FIG. 4, a constraining layer 131, a plurality of base-layer ceramic green sheets 101a, and a constraining layer (constraining-layer green sheet) 131 were then stacked in that sequence. Subsequently, a green stacked body 132 having a structure in which the constraining layers 131 were preferably disposed on both upper and lower surface sides of a green base layer (green ceramic substrate) A was made by pressure bonding (refer to FIG. 4).

In Example 3, the thickness of the green base layer (green ceramic substrate) A was preferably set to be about 300 µm, for example, and the thickness of the constraining layers 131 disposed on both upper and lower principal surfaces of the green base layer A was preferably set to be about 300 µm.

Although the base layer A having a multilayer structure was made by stacking the plurality of base-layer ceramic green sheets 101a in Example 3, a base layer having a single layer structure may preferably be made using a single base-layer ceramic green sheet 101a to manufacture a single-plate ceramic substrate.

Although the constraining layers 131 were disposed on both upper and lower surface sides of the base layer A in Example 3, the constraining layer 131 may preferably be disposed on only one principal surface of the base layer A.

In Example 3, each of the constraining layers 131 was formed from a single constraining-layer ceramic green sheet, but may preferably be formed by stacking a plurality of constraining-layer ceramic green sheets.

The green stacked body 132 was then heat-treated at a low debinding temperature (e.g., about 400° C.) in the atmosphere to remove an organic substance such as a binder.

Figure 5:
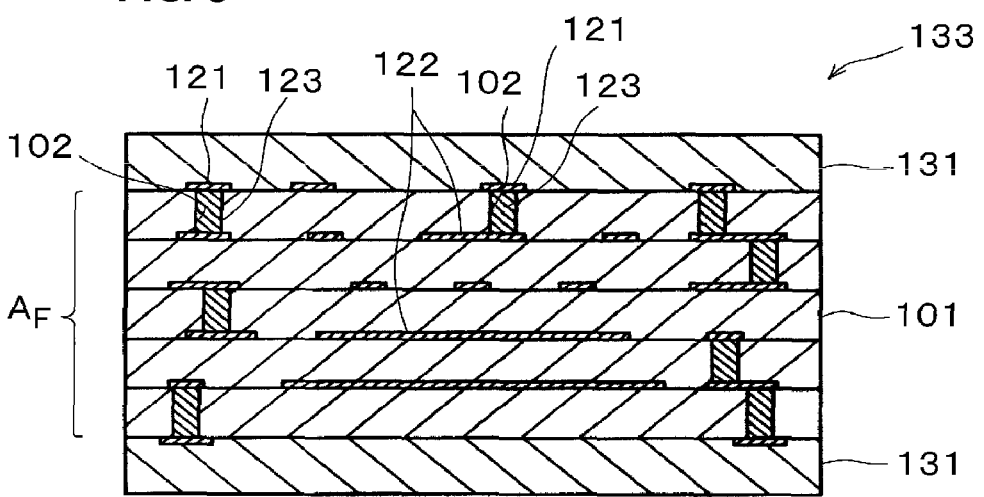
FIG. 5 shows a fired stacked body obtained by firing the green stacked body of FIG. 4.

After that, the temperature was increased to about 900° C., for example, under the conditions under which the base layer A is sintered but the ceramic powder defining the constraining layers 131 is not sintered, to fire the green stacked body 132. Thus, as shown in FIG. 5, a fired stacked body 133 with green constraining layers 131 disposed on both principal surfaces of a sintered base layer $A_F$ was obtained. The sintered base layer $A_F$ preferably defines a ceramic substrate (ceramic multilayer substrate) after the constraining layers 131 are removed. The sintered base layer $A_F$ includes an electrode (surface electrode) 121 formed on the surface thereof and inner conductors 122 disposed between a plurality of stacked insulating ceramic layers 101 and has a structure in which the inner conductors 122 are connected to each other or each of the inner conductors 122 and the surface electrode 121 are connected through a via hole conductor 123.

The constraining layers 131 were removed from the thus-obtained fired stacked body 133 while a reaction layer 124 (FIGS. 7A and 8) formed between the sintered base layer $A_F$ and the constraining layers 131 with the reaction therebetween preferably remained, by the method described below.

Figure 6:
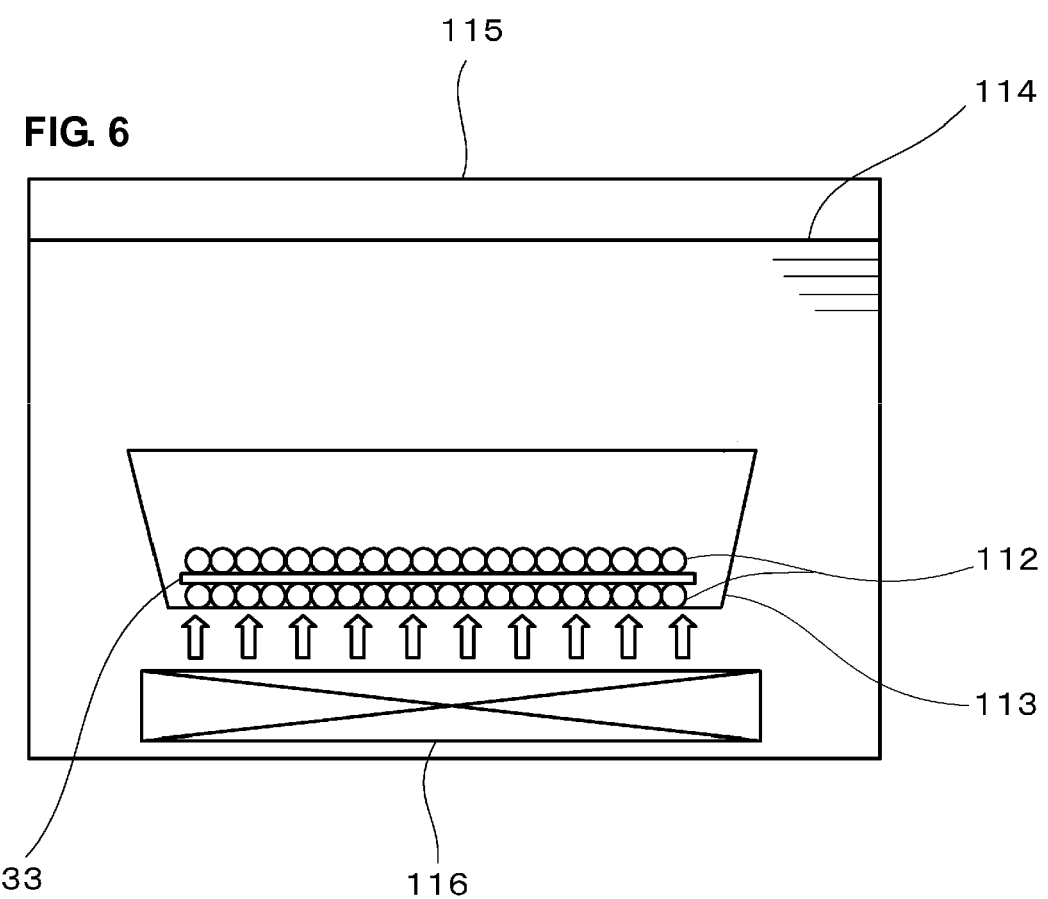
FIG. 6 shows a method for removing the constraining layers from the fired stacked body obtained by firing the green stacked body in Example 3.

As shown in FIG. 6, spherical media (hereinafter also referred to as zirconia balls) 112 preferably having a diameter of about 2 mm and made of zirconia ($ZrO_2$), for example, were spread over a stainless steel tray 113, and the fired stacked body 133 with green constraining layers 131 (FIG. 5) disposed on both principal surfaces of the sintered base layer $A_F$ (FIG. 5) was disposed thereon. Furthermore, for example, at least a single layer of zirconia balls 112 as media were preferably disposed on the fired stacked body 133 (a single layer of zirconia balls 112 is placed in FIG. 6).

All of the zirconia balls 112, the tray 113, and the fired stacked body 133 were inserted into an ultrasonic cleaning tank 115 filled with a processing solution 114. A constraining-layer removal process was preferably performed for about 15 minutes, for example, by applying an ultrasonic wave using an ultrasonic oscillator (output about 600 W, frequency about 40 KHz) 116 to vibrate the zirconia balls 112.

In this case, the constraining layers 131 were removed such that at least a portion of the surface electrode 121 formed on the surface of the sintered base layer $A_F$ was exposed while the reaction layer 124 remained in the region from the periphery of the surface electrode 121 to the surface of the sintered base layer (ceramic substrate) $A_F$.

To increase sound pressure when the ultrasonic wave is applied, deaerated water, for example, was preferably used as the processing solution 114.

For comparison, the constraining layers were removed from the fired stacked body with green constraining layers disposed on both principal surfaces of the sintered base layer that was made by the same method as that of Example 3, by spraying slurry including about 15% of a about #500 alumina abrasive grain at about 0.15 MPa through wet blasting.

After the sintered base layers from which the constraining layers were removed by the methods of Example 3 and the Comparative Example were cleaned, a Ni plating film preferably having a thickness of about 5 μm, for example, was formed on the surface electrode.

Subsequently, a Pd plating film preferably having a thickness of about 0.2 μm, for example, was formed on the Ni plating film, and an Au plating film preferably having a thickness of about 0.1 μm, for example, was formed on the Pd plating film. As a result, an electrode (surface electrode) 121 with a plating film 141 (refer to FIGS. 7B and 8) having a three-layer structure was formed on the Ag electrode.

For the samples made by the methods of Example 3 and the Comparative Example, the difference in elevation ΔH between the surface electrode having the plating film and the sintered base layer was measured. The result is shown in Table 2.

TABLE 2

| | Difference in elevation between surface electrode and surface of ceramic substrate (μm) |
|---|---|
| Example | 3 |
| Comparative Example | 12 |

The difference in elevation ΔH was obtained by measuring projections and depressions of a surface using Laser Microscope VK9700 available from KEYENCE CORPORATION.

Figure 7A:
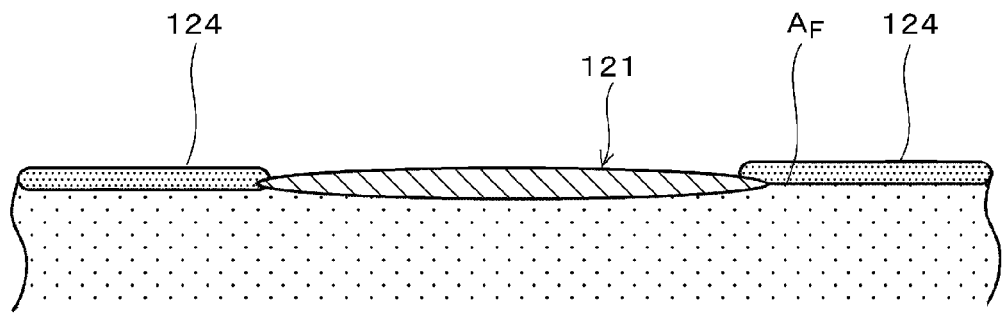
FIG. 7A shows a principal portion of a ceramic substrate manufactured by the method of Example 3 before a plating film is formed on a surface electrode.

As shown in Table 2, the difference in elevation ΔH between the surface electrode 121 and the sintered base layer (ceramic substrate) $A_F$ was about 12 μm for the sample of the Comparative Example, whereas the difference in elevation ΔH was about 3 μm for the sample of Example 3. That is to say, the difference in elevation for the sample of Example 3 was significantly reduced to about 3 μm due to the following reason.

Where a fired stacked body having a sintered base layer and green constraining layers is made and a constraining-layer removal process is then conducted for about 15 minutes, for example, by vibrating media that are disposed so as to be in contact with the constraining layers as in Example 3, as schematically shown in FIG. 7A, the surface electrode 121 formed on the surface of the sintered base layer (ceramic substrate) $A_F$ is exposed while the reaction layer 124 formed by the reaction between the base layer and the constraining layers remains in the region from the periphery of the surface electrode 121 to the surface of the sintered base layer $A_F$.

Figure 7B:
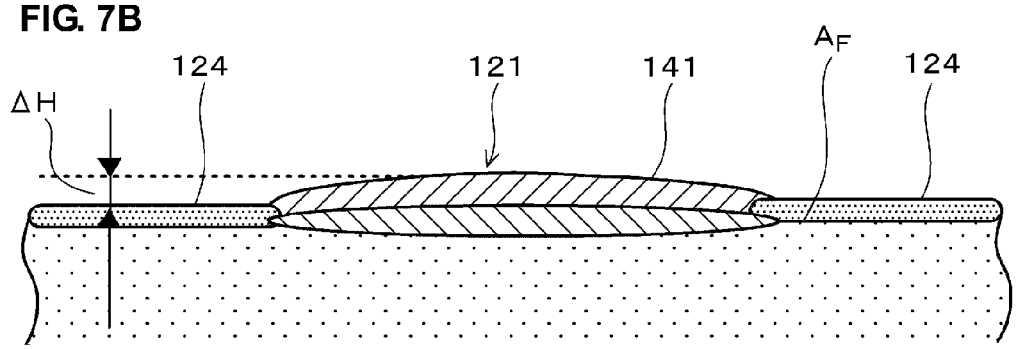
FIG. 7B shows a principal portion of a ceramic substrate manufactured by the method of Example 3 after a plating film is formed on a surface electrode.

As a result, as schematically shown in FIG. 7B, even when the plating film 141 described above is formed on the surface of the surface electrode 121, the reaction layer 124 functions to decrease the difference in elevation ΔH between the surface electrode 121 including the plating film 141 and the surface of the ceramic substrate $A_F$. Thus, a large difference in elevation ΔH is prevented.

In other words, the method according to a preferred embodiment of the present invention is to rub off constraining layer grains on the electrode using media and the vibrational energy of the media is not overly large. By suitably adjusting the conditions of the constraining-layer removal process (e.g., processing time, the size of media, and the magnitude of power applied), the constraining layers are sufficiently removed, but the close-grained reaction layer is not significantly rubbed off and most of the reaction layer remains. Consequently, since the height of the surface of the surface electrode does not change even after media are vibrated due to the reaction layer that normally remains on the surface of the ceramic substrate (sintered base layer) with a thickness of several micrometers to several tens of micrometers, the difference in elevation between the surfaces of the surface electrode and the ceramic substrate is decreased, which significantly improve coplanarity.

Figure 8:
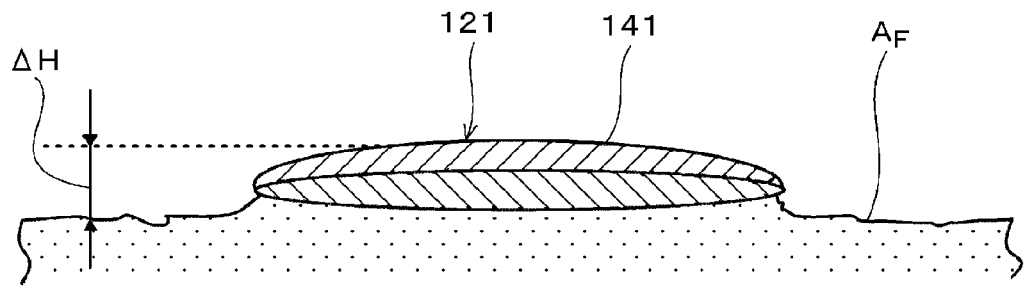
FIG. 8 shows a difference in elevation between the surface electrode and the surface of a sintered base layer in a ceramic substrate in which a constraining layer is removed by the method of a Comparative Example.
Figure 9:
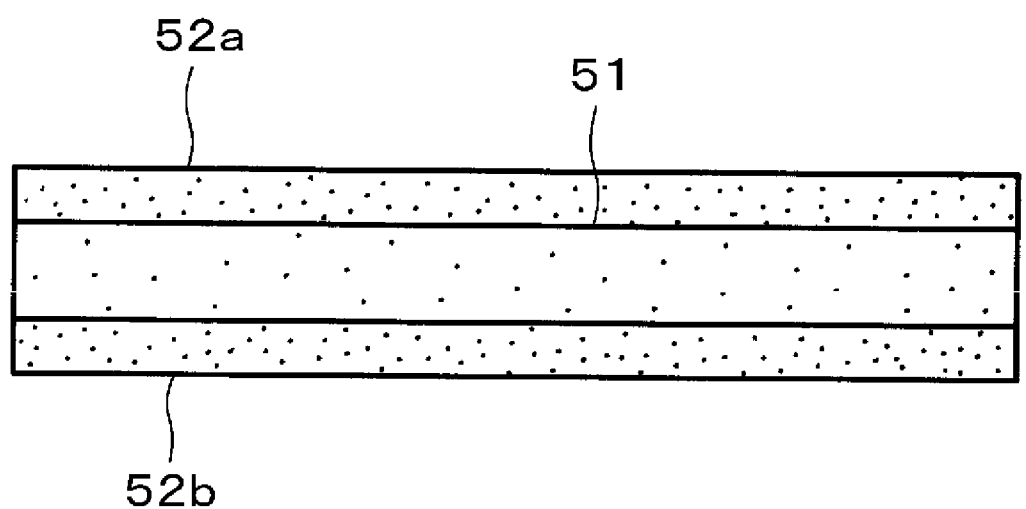
FIG. 9 shows a method for manufacturing a ceramic substrate by an existing constraint firing method.

In contrast, the method of the Comparative Example is to grind the constraining layers and the reaction layer using an abrasive grain and the reaction layer that is harder than the constraining layers is quickly ground, which readily a level difference. When the constraining layers on the electrode have been removed, almost all the reaction layer formed by the reaction between the base layer and the constraining layers has also has been removed. Therefore, as schematically shown in FIG. 8, the reaction layer does not decrease the difference in elevation ΔH between the surface electrode 121 including the plating film 141 and the sintered base layer (ceramic substrate) $A_F$, and thus such a large value shown in Table 2 is obtained.

In the method of Example 3, the constraining layers 131 can preferably be removed such that at least a portion of the electrode (surface electrode) formed on the surface of the sintered base layer $A_F$ is exposed while the reaction layer remains at the boundary between the periphery of the surface electrode and the sintered base layer around the surface electrode. The reaction layer decreases the difference in elevation between the surfaces of the surface electrode and the ceramic substrate, which significantly improves coplanarity.

In Example 3, the reaction layer preferably remains so as to cover the boundary between the periphery of the exposed surface electrode and the sintered base layer around the surface electrode. Thus, for example, the reaction layer functions as a protective layer that suppresses the migration of electrode material.

To measure the effects of the particle size of media, a ceramic substrate was manufactured using the step of removing the constraining layers from the fired stacked body in the same method as that of Example 3, except that spherical media (zirconia balls) having a diameter of about 1 mm and made of zirconia ($ZrO_2$) and spherical zirconia balls having a diameter of about 3 mm were used.

Consequently, when the zirconia balls having a diameter of about 1 mm were used, the energy was too low to efficiently remove the constraining layers due to their mass being too small even if the media were vibrated by applying an ultrasonic wave, which was undesirable.

When the output of the ultrasonic wave was increased to provide higher energy (that is, sound pressure was increased), the media flew out of the tray due to their mass being too small. As a result, a desired effect was not produced.

When the zirconia balls having a diameter of about 3 mm were used, sufficient energy was provided due to their mass being relatively large, but the intervals between contact points became large due to their curvature being too large, which prevented the constraining layers from being efficiently removed.

Accordingly, spherical zirconia balls having a diameter in a range of about 1 mm to about 3 mm, for example, are preferably used under the conditions described in Example 3.

However, since the preferable diameter range of the media is affected by the thickness of the constraining layer, the material of the constraining layer, the specific gravity of the processing solution, or other factors, the preferable diameter range of the media is not necessarily limited to the range described above.

The present invention is not limited to the Examples of preferred embodiments described above. Various applications and modifications can be made within the scope of the present invention regarding the specific kind or blending ratio of ceramic powder and glass material constituting the base layer, the structure or material of the electrode disposed in the base layer, the specific kind of material constituting the constraining layer, and the conditions under which an ultrasonic wave is applied.

According to preferred embodiments of the present invention as described above, when a ceramic substrate is manufactured with a constraint firing step, a constraining layer is removed from a sintered base layer without causing significant damage to, for example, the sintered base layer and an electrode formed on the surface of the sintered base layer and the electrode can be reliably exposed. Consequently, a ceramic substrate with high reliability can be efficiently manufactured.

Accordingly, preferred embodiments of the present invention can be widely used for the manufacturing technology of a ceramic substrate manufactured through a constraint firing step.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a ceramic substrate comprising:
   a first step of forming a green stacked body including:
      a base layer defining a ceramic substrate after firing, the base layer including ceramic powder and glass material; and
      a constraining layer disposed so as to be in contact with at least one principal surface of the base layer, the constraining layer being primarily composed of ceramic powder that is not substantially sintered at a sintering temperature of the base layer;
   a second step of obtaining a fired stacked body having a sintered base layer and a green constraining layer by firing the green stacked body to sinter the base layer; and
   a third step of removing the constraining layer from the sintered base layer by vibrating media that are disposed so as to be in contact with the constraining layer;
   wherein
   the media are defined by a solid material.

2. The method for manufacturing a ceramic substrate according to claim 1, wherein, in the third step, an ultrasonic wave is applied to vibrate the media while the fired stacked body and the media are immersed in a processing solution.

3. The method for manufacturing a ceramic substrate according to claim 2, wherein, in the third step, the ultrasonic wave is applied while the fired stacked body is disposed in a tray, with the media being arranged in the tray, such that the constraining layer is in contact with the media.

4. The method for manufacturing a ceramic substrate according to claim 2, wherein, in the third step, the fired stacked body is disposed in a tray such that the constraining layer faces upward, the media are spread over the fired stacked body, and the ultrasonic wave is applied while the constraining layer is in contact with the media.

5. The method for manufacturing a ceramic substrate according to claim 2, wherein, when the constraining layer of the fired stacked body is disposed on both of one principal surface side and another principal surface side of the sintered base layer, in the third step, the fired stacked body is disposed in a tray, with the media being arranged in the tray, the media are further spread over the fired stacked body, and the ultrasonic wave is applied while the constraining layer disposed on both of the one principal surface side and the other principal surface side of the fired stacked body is in contact with the media.

6. The method for manufacturing a ceramic substrate according to claim 2, wherein deaerated water is used as the processing solution.

7. The method for manufacturing a ceramic substrate according to claim 2, wherein a specific gravity of the media is greater than that of the processing solution.

8. The method for manufacturing a ceramic substrate according to claim 1, wherein a hardness of the media is greater than that of the constraining layer.

9. The method for manufacturing a ceramic substrate according to claim 1, wherein the media have a substantially spherical shape.

10. The method for manufacturing a ceramic substrate according to claim 1, wherein the media are made of zirconia.

11. A method for manufacturing a ceramic substrate comprising:
   a first step of forming a green stacked body including:
      a base layer defining a ceramic substrate after firing, the base layer including ceramic powder and glass material, an electrode being formed on a surface of the base layer; and a constraining layer disposed so as to be in contact with at least one principal surface of the base layer, the constraining layer being primarily composed of ceramic powder that is not substantially sintered at a sintering temperature of the base layer;

a second step of obtaining a fired stacked body having a reaction layer formed between a sintered base layer and the constraining layer by a reaction therebetween by firing the green stacked body to sinter the base layer; and a third step of removing the constraining layer from the sintered base layer by vibrating media that are disposed so as to be in contact with the constraining layer;

wherein in the third step, at least a portion of the electrode is exposed while the reaction layer remains at a boundary between a periphery of the electrode and the sintered base layer around the electrode; and the media are defined by a solid material.

12. The method for manufacturing a ceramic substrate according to claim 11, wherein the reaction layer remains not only at the boundary between the periphery of the electrode and the sintered base layer around the electrode but also in a different region of a surface of the sintered base layer.

* * * * *